United States Patent [19]
Keller et al.

[11] Patent Number: 5,665,993
[45] Date of Patent: Sep. 9, 1997

[54] INTEGRATED CIRCUIT INCLUDING A FET DEVICE AND SCHOTTKY DIODE

[75] Inventors: Stephen A. Keller, Sugarland; Rajiv R. Shah, Richardson, both of Tex.

[73] Assignee: Texas Instruments Incorporated, Dallas, Tex.

[21] Appl. No.: 621,674

[22] Filed: Mar. 26, 1996

Related U.S. Application Data

[62] Division of Ser. No. 316,588, Sep. 29, 1994, abandoned.

[51] Int. Cl.$^6$ .................................................. H01L 27/095
[52] U.S. Cl. .......................... 257/377; 257/382; 257/383; 257/384; 257/476; 257/485
[58] Field of Search ............................ 257/382, 383, 257/384, 476, 454, 455, 456, 412, 370, 377, 378, 478, 485, 486

[56] References Cited

U.S. PATENT DOCUMENTS

| | | | |
|---|---|---|---|
| 4,803,539 | 2/1989 | Psaras et al. | 257/742 |
| 4,811,076 | 3/1989 | Tigelaar et al. | 257/315 X |
| 5,045,916 | 9/1991 | Vor et al. | 257/383 |
| 5,064,773 | 11/1991 | Feist | 437/31 |
| 5,334,549 | 8/1994 | Eklund | 437/59 |
| 5,541,134 | 7/1996 | Eklund | 437/59 |

*Primary Examiner*—William Mintel
*Attorney, Agent, or Firm*—W. Daniel Swayze, Jr.; W. James Brady, III; Richard L. Donaldson

[57] ABSTRACT

A method for constructing a Schottky diode in an integrated circuit on a semiconductor substrate (18) includes forming a mask layer (22) over a region (12) of the semiconductor substrate which the Schottky diode is to be formed. First portions of said mask layer (22) are removed to expose first regions (11) of said substrate (18). At least one semiconductor processing step is performed prior to the formation of the Schottky diode, which has processing temperature above about 450° C. in said first regions (11) of said substrate (18), such as forming TiSi$_2$ (33–35) in portions of an FET device in the integrated circuit. A second portion of said mask layer (22) is removed to expose a second region (12) of said semiconductor substrate (18) at which said Schottky diode is to be formed, and a region (48) is formed in said semiconductor substrate (18) comprising a metal and a material of said semiconductor substrate (18) in said second region (12), such as platinum silicide. Additionally disclosed are techniques for forming contacts (139) to the Schottky diode (115) and other integrated circuit structures (107,108) at temperatures below those that would damage the Schottky diode (115).

1 Claim, 6 Drawing Sheets

INTEGRATED CIRCUIT INCLUDING A FET DEVICE AND SCHOTTKY DIODE

This is a divisional of application Ser. No. 08/316,588 filed on Sep. 29, 1994, now abandoned.

BACKGROUND OF THE INVENTION

1. Field of the Invention

This invention relates to improvements in general to semiconductor processing techniques, and more particularly to semiconductor processing techniques that can be used in advanced BiCMOS processes, and in particular to improvements in methods for fabricating high barrier PtSi Schottky diodes in a Ti-Silicided MOS structure which can be used in a high performance BiCMOS processes.

2. Relevant Background

Process techniques have been proposed for the optimal merge of advanced bipolar and advanced CMOS techniques for fabricating BiCMOS devices. Such approaches to advanced BiCMOS processing, however, have been directed primarily to ECL-CMOS applications. Such ECL-CMOS applications do not require the formation of high barrier Schottky diodes, such as PtSi Schottky diodes. The merger of bipolar and CMOS process flows for these applications is therefore relatively straightforward.

Such BiCMOS based approaches generally use $TiSi_2$ for cladding the MOS gate and its source/drain regions, as well as the emitter, extrinsic base, and collector regions of any bipolar transistors. The process also results in the natural formation of $TiSi_2$ Schottky diodes. These, however, have a low barrier height of 0.50 V, compared to the 0.90 V for PtSi Schottky diodes. As a result, the $TiSi_2$ Schottky diodes might not be usable directly in circuit applications.

For those circuits that require high barrier Schottky diodes, such as TTL, STTL and STL logic schemes and also Schottky clamped SRAM cells, a need exists for modifying the Ti-Silicided CMOS-based BiCMOS process so that PtSi Schottky diodes can be easily incorporated in the process. A concern in incorporating PtSi in such a process is the requirement that all processing after the PtSi has been formed be confined to temperatures no higher than 450° C. A further concern in such a process is the presence of $TiSi_2$ across significant portions of the slice prior to forming PtSi. The present invention discusses several methods for the integration of PtSi Schottky diodes with the minimal addition of processing to advanced BiCMOS processes proposed before in the aforementioned disclosures.

SUMMARY OF THE INVENTION

In light of the above, therefore, it is an object of the invention to provide an improved BiCMOS process.

It is another object of the invention to provide a method in which high barrier PtSi Schottky diodes can be fabricated in a Ti-Silicided CMOS structure based upon a high performance BiCMOS process.

It is yet another object of the invention to provide a modification to an existing Ti-Silicided CMOS-based BiCMOS process that enables PtSi Schottky diodes to be incorporated into the process.

These and other objects, features and advantages of the invention will be apparent to those skilled in the art from the following detailed description of the invention, when read in conjunction with the accompanying drawings and appended claims.

In accordance with a broad aspect of the invention, a method is presented for constructing a Schottky diode in an integrated circuit on a semiconductor substrate. The method includes the steps that include forming a mask layer over a region of the semiconductor substrate at which the Schottky diode is to be formed. The mask layer can be, for example, polysilicon, TEOS (tetra-ethyl-ortho-silicate), or the like. First portions of the mask layer are removed to expose first regions of the substrate. At least one semiconductor processing step is performed, which has a processing temperature above about 450° C. in the first regions of the substrate. Such semiconductor processing step may be, for instance, forming regions of $TiSi_2$ on the semiconductor substrate. A second portion of the mask layer is then removed to expose a second region of the semiconductor substrate at which the Schottky diode is to be formed. A region is then formed in the semiconductor substrate comprising a metal and a material of the semiconductor substrate in the second region. The substrate may be, for example, silicon and the metal platinum, whereby the region is formed of platinum silicide (PtSi) to form a Schottky diode with the substrate.

If an FET device structure is desired to be included in the integrated circuit, the step of removing first portions of the mask layer may be performed to expose at least portions of drain and source regions of the FET device. During the formation of $TiSi_2$, the $TiSi_2$ may be formed in the source and drain regions of the FET. Thereafter, during the formation of the PtSi region, PtSi regions may also be formed in the $TiSi_2$ regions of the source and drain of the FET.

In accordance with another broad aspect of the invention, a method is presented for constructing a Schottky diode in an integrated circuit on a semiconductor substrate in which an FET device having source, drain, and gate elements has already been formed. The method includes forming a TEOS layer over the substrate, then removing a portion of the TEOS layer to provide a TEOS mask with a portion remaining over at least a location of the substrate at which the Schottky diode is to be formed and at sidewall regions of the gate of the FET. $TiSi_2$ is formed in regions of the source and drain, and gate of the FET. Another mask is formed over the substrate to expose a portion of the TEOS mask overlying a region of the substrate at which the Schottky diode is to be formed and at least portions of the $TiSi_2$ in the source and drain regions of the FET. The formation of the $TiSi_2$ may be performed at process temperatures in excess of 450° C. The exposed TEOS mask is removed, and platinum silicide regions are formed in the substrate in the region at which the Schottky diode is to be formed and in the portions of the $TiSi_2$ formed in the source and drain regions of the FET.

In accordance with still another broad aspect of the invention, a method is presented for constructing a Schottky diode in an integrated circuit on a semiconductor substrate in which an FET device having source, drain, and gate elements has already been formed. In accordance with this embodiment, a polysilicon layer is formed over the substrate, and a portion of the polysilicon layer is removed to provide a polysilicon mask having a portion remaining over at least a location of the substrate at which the Schottky diode is to be formed. $TiSi_2$ is formed in regions of the source and drain, in the gate of the FET, and in the polysilicon mask. The formation of the $TiSi_2$ may be performed at process temperatures in excess of 450° C. Another mask is patterned over the substrate to expose a portion of the polysilicon mask overlying a region of the substrate at which the Schottky diode is to be formed, and the exposed polysilicon mask is removed to expose the substrate. Finally, platinum silicide is formed in the exposed substrate.

According to yet another broad aspect of the invention, a method is presented for constructing a Schottky diode in an integrated circuit on a semiconductor substrate in which an FET device having source, drain, and gate elements has been formed. The method includes forming a TEOS layer over the substrate and removing a portion of the TEOS layer to provide a TEOS mask with a portion remaining over at least a location of the substrate at which the Schottky diode is to be formed and at sidewall regions of the gate of the FET. $TiSi_2$ is then formed in regions of the source and drain, and on the gate of the FET. At least one insulation layer is then formed overall, and another mask is formed and patterned over the insulation layer to expose a portion of the insulation layer overlying a region of the substrate at which the Schottky diode is to be formed. The insulation layer may comprise a first layer of TEOS of thickness of between about 1000 Å and 3000 Å and a second layer of PSG (phosphorosilica glass) of thickness greater than about 2000 Å that has been annealed at a temperature of about 800° C.

The exposed portion of the insulation layer is removed, and a platinum silicide region is formed in the substrate in the region at which the Schottky diode is to be formed. A second insulation layer is then formed overall. The second insulation layer may be, for instance, a planarized oxide layer. A mask layer is patterned to expose the second insulation layer at locations above the source and drain of the FET, and above the Schottky diode, and the second insulation layer is removed in the exposed regions to form contact holes. The contact holes are then filled with a conductor using a process that has a processing temperature less than 450° C. The conductor may be, for example, tungsten that is deposited by a CVD process.

A conductive layer may then be formed overall to contact the conductor filled in the contact holes, and the conductive layer patterned to form selective connections to the source and drain of the FET device and to the Schottky diode.

In accordance with yet another broad aspect of the invention, a method is presented for constructing an integrated circuit having CMOS transistors and a Schottky diode in a semiconductor substrate. The method includes forming gate elements for the CMOS transistors on the substrate, and forming a layer, such as TEOS, over the substrate and the gate elements. A first mask is patterned on the layer to expose a first portion of the layer over a P-well in the substrate in which an n-channel MOS transistor is to be located. The first portion of the layer is then removed, exposing source and drain regions of the n-channel transistor and leaving a portion on sidewalls of the gate element of the n-channel-transistor. An N type impurity is then introduced into the source and drain regions of the n-channel transistor using the gate and remaining sidewall portions of the layer as a mask. A second mask is patterned on the layer to expose a second portion of the layer over an N-well in the substrate in which a p-channel MOS transistor is to be located. The second portion of the layer is removed to expose source and drain regions of the p-channel transistor and leaving a portion on sidewalls of the gate element of the p-channel transistor. A P type impurity is introduced into the source and drain regions of the p-channel transistor using the gate and remaining sidewall portions of the layer comprising silicon as a mask. An insulation layer is then formed overall. The insulation layer is patterned to provide holes extending from a surface of the insulation layer to the source and drain regions of the n-channel and p-channel transistors, and to a portion of the layer that overlies a region in the substrate at which the Schottky diode is to be formed. $TiSi_2$ is formed in regions of the sources and drains of the n-channel and p-channel transistors. The exposed layer is removed from over the region in the substrate at which the Schottky diode is to be formed, and platinum silicide is formed in the substrate in the region at which the Schottky diode is to be formed.

In accordance with yet another broad aspect of the invention, an integrated circuit is presented. The integrated circuit is formed in a semiconductor substrate, and has a FET device formed in the substrate, with source, drain, and gate elements. A region of $TiSi_2$ has been formed in each of the source, drain, and gate elements, and a Schottky diode comprising a layer comprising a metal, such as platinum silicide, has been formed in the substrate.

BRIEF DESCRIPTION OF THE DRAWINGS

The invention is illustrated in the accompanying drawings, in which.

In the various figures of the drawings, like reference numerals are used to denote like or similar parts. Additionally, the drawings are not necessarily drawn to scale.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

Figure 1A:
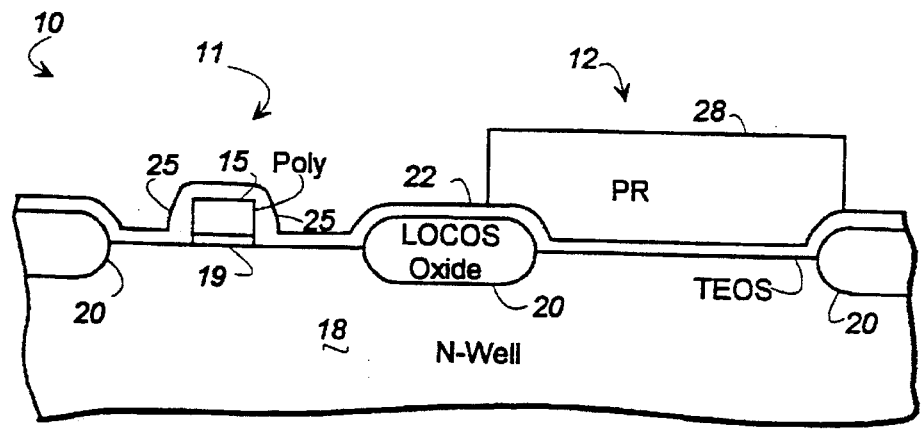
FIGS. 1a–1c are plan cross-sectional views of an integrated circuit chip in various stages of construction in the formation of a Schottky diode together with an FET device, in accordance with a preferred embodiment of the invention, using a TEOS spacer layer.
Figure 1B:
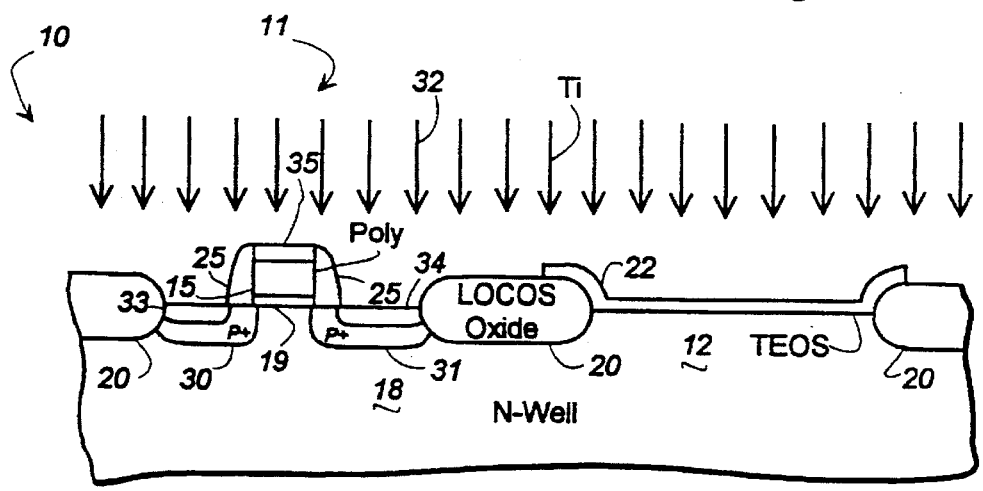
Figure 1C:
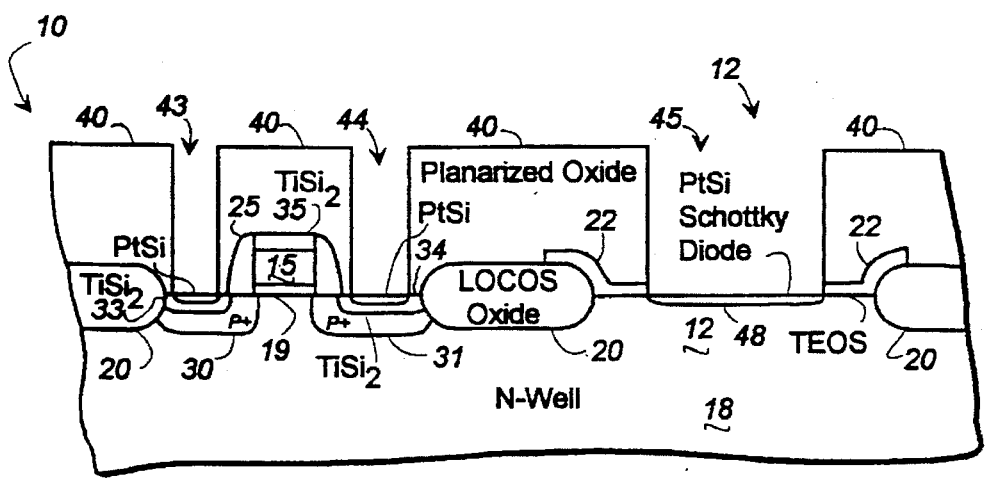

Various steps in a preferred embodiment of the invention for forming a Schottky diode in an integrated circuit manufacturing process is shown in FIGS. 1a–1c. As will become apparent the integrated circuit manufacturing process may be, for example, an advanced BiCMOS process, or the like. As shown in FIG. 1a, a structure 10 is presented that has been constructed in accordance with known semiconductor processing techniques to provide a location 11 at which an FET device will be formed, and a location 12 at which a Schottky diode will be formed. As will become apparent, the FET constructed at the location 11 may be one transistor of a pair of complimentary metal oxide (CMOS) transistors (or even bipolar transistors that can be formed as a part of such CMOS process), the p-channel transistor being shown in FIGS. 1a–1c for purposes of illustration. The stage of fabrication to which the structure 10 has been fabricated and shown in FIG. 1a provides a polysilicon gate 15 separated by a gate dielectric 19 from a semiconductor substrate 18. The substrate 18 may be provided, for example, by an N-well 18, which may be formed at a surface region of a semiconductor, preferably silicon, chip. The gate dielectric 19 may be a single or multilayered oxide or dielectric material, as known in the art.

A number of oxide isolation regions 20 are provided separating each of the devices to be formed in the structure 10. The oxide isolation regions 20 may be formed, for example, by a local or selective oxide (LOCOS) technique, such techniques being well known in the art. A layer 22 such as a layer including silicon in part, and, more particularly, a TEOS (tetra-ethyl-ortho-silicate) layer is formed overall. The TEOS layer 22 is conformal to the features of the structure. Thus, the TEOS layer 22 exists at the sidewall regions 25 of the polysilicon gate 15.

A photoresist layer 28 formed on the entire structure is patterned and removed to provide a mask, as shown, with a portion over the region of the TEOS layer 22 that overlies the region 12 at which the Schottky diode is desired to be formed. The region 12 is referred to herein as the Schottky diode moat region. In the embodiment illustrated, the photoresist mask 28 extends partially over the adjacent LOCOS oxide islands, as well as completely over the Schottky diode moat region 12.

From this beginning construction stage, the TEOS layer 22 is etched with an anisotropic technique, such techniques being known in the art, to be removed from the structure in regions other than those regions masked by the photoresist mask 28 over the Schottky diode moat region 12 and at the sidewall regions 25 on the polysilicon gate 15, to produce a structure as shown in FIG. 1b. The photoresist mask 28 is then removed.

In the structure of FIG. 1b the source and drain regions 30 and 31, respectively, of the p-channel transistor formed at the transistor location 11 have been implanted with a donor impurity, such as phosphorus, and the impurity has been diffused under the sidewall spacers 25 to define the channel of the transistor. Although the source and drain implant technique is not shown, such techniques are well known in the art. Thereafter, titanium 32 is deposited and reacted to provide titanium silicide (TiSi$_2$) regions in all of the exposed silicon or polysilicon regions, including regions 33 and 34 respectively in the source and drain regions 30 and 31 of the transistor and region 35 in the polysilicon gate 15.

During the titanium silicide formation, the remaining portion of the TEOS layer 22 provides a mask over the Schottky diode moat region 12 to block the titanium atoms from reacting with the N-well substrate 18. It should be noted that any semiconductor process that is performed at temperatures above 450° C. needs to be performed prior to the formation of the Schottky diode because the diffusion characteristics of platinum in silicon would allow the migration of platinum to undesired locations in the silicon substrate, thereby reducing or destroying the desired Schottky diode. Thus, the formation of the titanium silicide regions, which is performed at temperatures above 450° C., is performed prior to the formation of the Schottky diode in the Schottky diode moat region 12.

After the titanium silicide has been formed in the desired areas, an oxide masking layer 40 is formed overall, as shown in FIG. 1c. The oxide masking layer 40, which may be planarized, is patterned to provide holes or windows 43, 44, and 45 extending respectively to the surface of the source 30 and drain 31 of the transistor, and over the Schottky diode moat region 12. Platinum or other metal used to form the Schottky diode, is deposited into the exposed regions of the N-well substrate 18. The combination of the platinum with the material of the N-well substrate 18 may be, for example, by a sintering process to provide a layer 48 of platinum silicide (PtSi) to form the Schottky diode with the N-well substrate 18, and which will have a barrier height of about 0.9 volts. On the other hand, the platinum silicide that is formed in the titanium silicide regions of the source and drain 30 and 31 of the FET form only ohmic contacts due to the small potential difference due to the highly doped source and drain regions. Contacts to the source and drain regions as well as to the Schottky diode can then be constructed, an a manner such as one of those described below, and the integrated circuit construction process continued.

It should be noted that in the construction of the structure 10 that includes the platinum silicide Schottky diode and FET structures, premetal planarization is not required. OCD or SOG (spin on glass) planarization can also be used, if desired. It is also noted that platinum may be deposited over all open contacts, even into the contacts over regions of titanium silicide as shown. The platinum silicide will have little effect on the sheet resistance of the titanium silicide regions. This approach can be accomplished with the addition of only a single mask to a typical integrated circuit process flow.

Figure 2A:
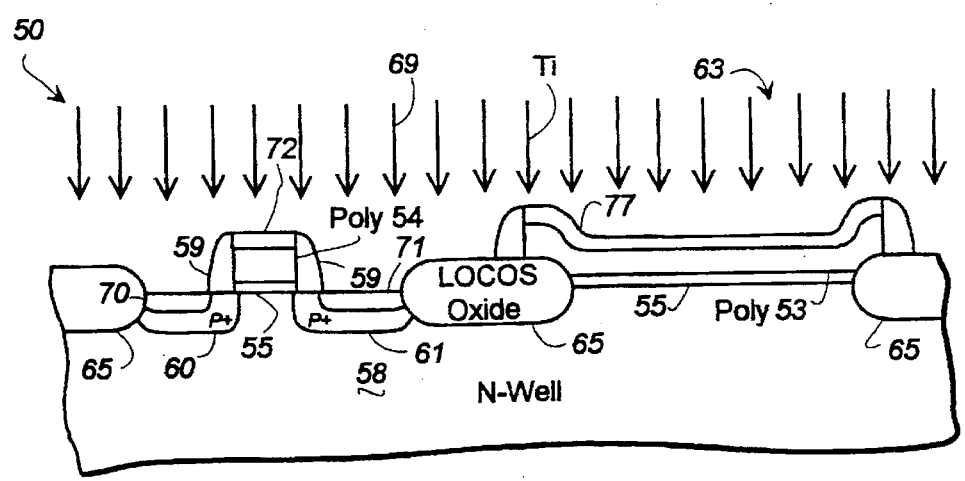
FIGS. 2a–2c are plan cross-sectional views of an integrated circuit chip in various stages of construction in the formation of a Schottky diode together with an FET device, in accordance with another preferred embodiment of the invention, using a polysilicon spacer layer.
Figure 2B:
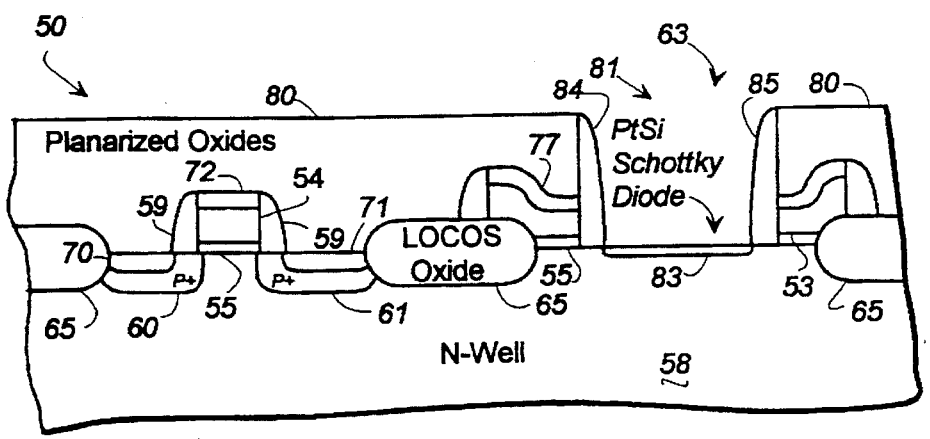
Figure 2C:
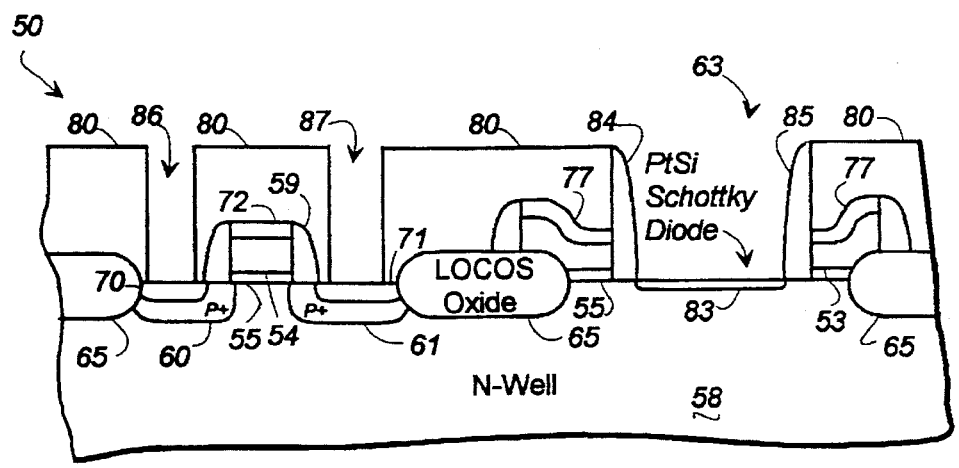

Another embodiment of the method in accordance with the invention, to construct FET and Schottky diode structures in an integrated circuit process is shown in FIGS. 2a–2c. In FIG. 2a, the structure 50 has been processed to the stage corresponding to that of FIG. 1b described above, except, in the embodiment of FIG. 2a, a polysilicon layer 53 is used in place of the TEOS layer described with reference to the embodiment of FIGS. 1a–1c.

The transistor structure 50 includes a polysilicon gate 54 formed over a single or multilevel dielectric 55 on the surface of an N-well substrate 58. The polysilicon gate 54 has TEOS sidewall spacers 59. Source 60 and drain 61 regions are provided on each side of the gate 54, and, in a manner similar to that described above, the polysilicon layer 53 is patterned over the region 63 in which the Schottky diode is to be formed, and for a distance on each side, for example, over the LOCOS oxide isolation regions 65. As shown, titanium 69 is deposited and reacted to form titanium silicide regions 70, 71, and 72, respectively in the source 60, drain 61 and gate 54 of the FET device. The polysilicon layer 53 blocks the passage of the titanium from entering the N-well substrate 58, being deposited on the surface 77, as shown.

Thereafter, a layer of oxide 80 may be formed overall, as shown in FIG. 2b, and patterned to provide a hole or window 81 over the Schottky diode moat region 63. Platinum is then introduced at the base of the window 81 at the surface of the N-well substrate 58 to provide a platinum silicide region 83 that forms a Schottky diode in combination with the material of the N-well substrate 58. As seen in FIG. 2b, oxide sidewall portions 84 and 85 may be formed on the sidewalls of the oxide layer 80, thereby isolating the platinum silicide Schottky diode device formed at the base of the hole or window 81. It should be noted that the oxides 80 may be planarized, if desired, to facilitate subsequent processing steps.

Thereafter, the layer of oxide 80, which may be planarized, is used as a mask for the formation of contacts to the titanium silicide regions 70 and 71 in the source and drain region 60 and 61 of the FET device. Thus, holes or windows 86 and 87 are patterned in the layer of oxides 80 over the respective source and drain regions of the transistor. The device can be completed in the manner described below.

As with the structure formed in accordance with FIGS. 1a–1c described above, the structure of FIGS. 2a–2c adds only a single mask to a typical semiconductor process flow. Also, as mentioned, processing temperatures must be kept below the temperatures that enable migration of the metal atoms of the metal used in the formation of the Schottky diode, after the formation of the diode to preserve its integrity. Thus, for example, in the case of platinum, after the platinum silicide Schottky diode has been formed, the structure should be processed at temperatures below 450° C. This may cause some problems in subsequent interconnect processes, but is addressed in the method next described with reference to FIGS. 3a–3e.

Figure 3A:
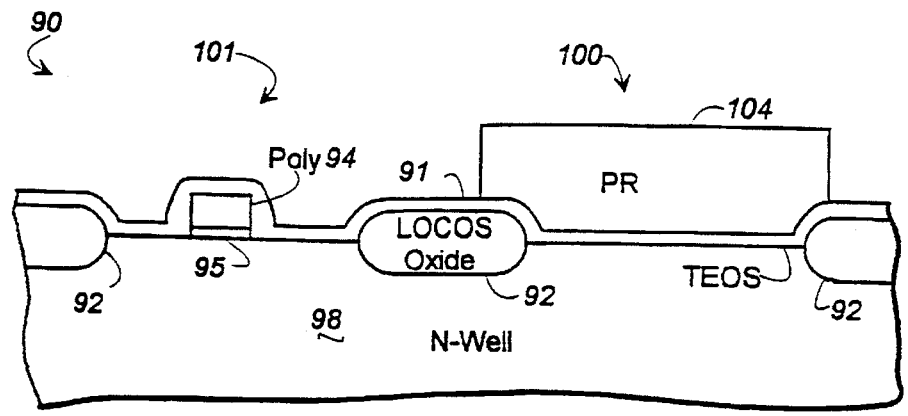
FIGS. 3a–3e are plan cross-sectional views of an integrated circuit chip in various stages of construction in the formation of a Schottky diode together with an FET device with interconnections thereto, in accordance with another preferred embodiment of the invention, using a TEOS spacer layer.

The start of the process is shown in FIG. 3a in which a structure 90 is formed having a TEOS layer 91 overlying the LOCOS oxide isolation regions 92, the location 101 of the FET, and the Schottky diode moat region 100. A polysilicon gate 94 is separated from the N-well substrate 98 by its gate dielectric 95. A photoresist layer 104 is formed over the surface of the structure and patterned to provide a mask over the Schottky diode moat 100, and extending partially over the LOCOS oxide regions 92 on the sides of the Schottky diode moat region 100.

Figure 3B:
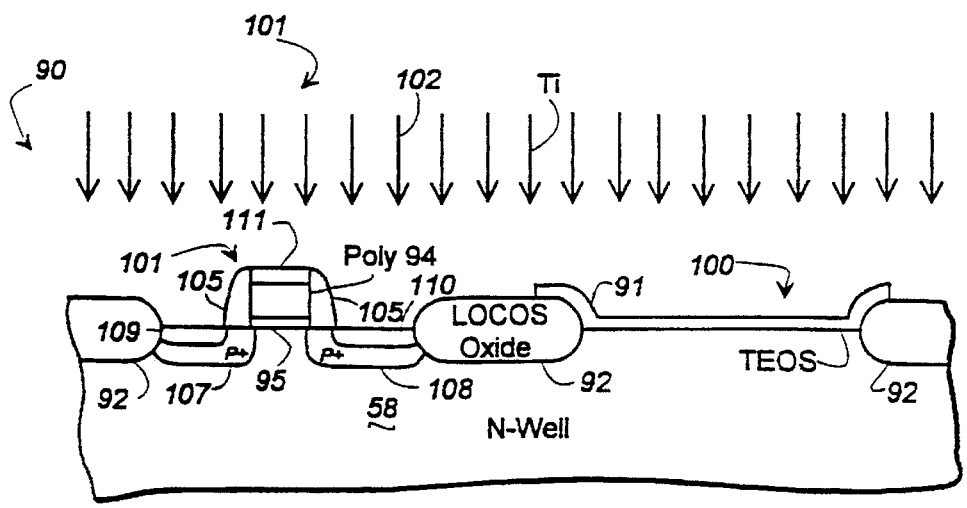

As shown in FIG. 3b, the TEOS layer 91 that is masked by the photoresist layer 104 is removed leaving the region shown over the Schottky diode moat region 100 and at the sidewalls 105 of the polysilicon gate 94 of the FET device. The source and drain region implants 107 and 108 are constructed and diffused to the regions beneath the TEOS sidewall spacers 105. Titanium 102 is deposited and reacted to produce titanium silicide regions 109, 110, and 111 in the respective source 107, drain 108, and gate 94 regions of the FET. As before, the TEOS layer 91 overlying the Schottky diode moat region 100 and the sidewall regions 104 of the FET block the titanium from entering into the regions therebeneath.

Figure 3C:
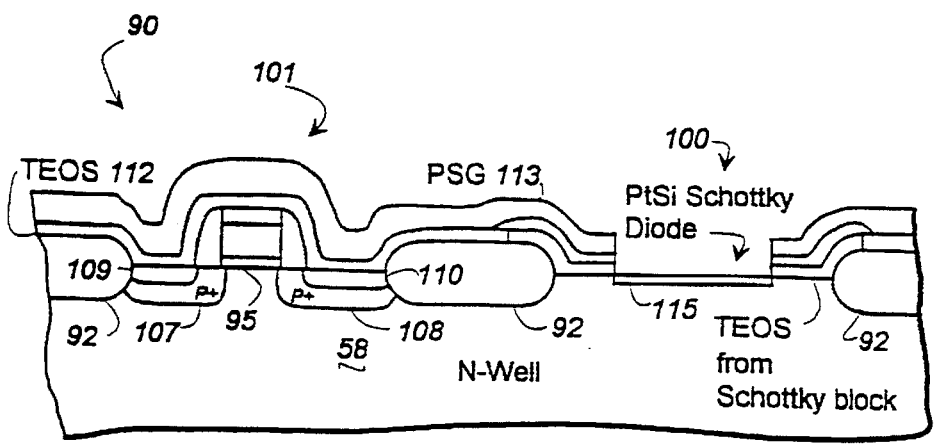

After the titanium silicide regions have been formed, an additional TEOS layer 112 is formed overall, followed by an insulating or isolating layer of PSG (phosphorosilica glass) 113, as shown in FIG. 3c. The TEOS layer 112 may be deposited to a thickness of between about 1,000 Å and 3000 Å, and the PSG layer 113, which may be a layer of 5% of PSG, may be formed to a thickness greater than 2000 Å, for example, about 3,000 Å. After the formation of the overall TEOS layer 112 and PSG layer 113, and prior to the formation of the Schottky diode, the structure is annealed at a temperature of between about 700° C. to 800° C. for a time between about 45 minutes and 30 minutes to densify the PSG layer 113.

Figure 3D:
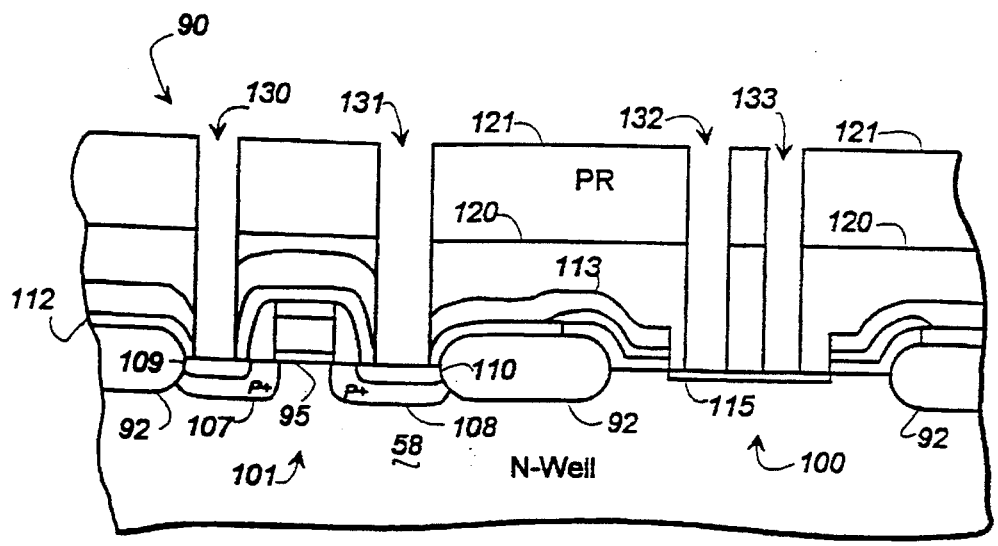

The Schottky diode region is then masked the overlying layers are then removed, such as by etching or other similar process, and platinum is deposited. The platinum may be sintered and excess platinum stripped from the structure. The resulting Schottky diode 115 that has been formed at this point is shown in the structure 90 of FIG. 3c. As mentioned, in order to perform further processing on the structure 90, care should be taken to insure that additional processing steps can be carried out at temperatures less than about 450° C. Accordingly, as shown in FIG. 3d, a layer of oxide 120 is formed overall followed by a layer of photoresist 121. The oxide layer 120 may be planarized, if desired. The photoresist layer 121 is patterned to form holes or windows 130, 131, 132, and 133 from the surface of the photoresist layer 121 to the various surfaces of the silicon devices. Thus, the window 130 is located over the source region 107, the window 131 over the drain region 108, and the windows 132 and 133 are located on the surface of the Schottky diode 115.

Figure 3E:
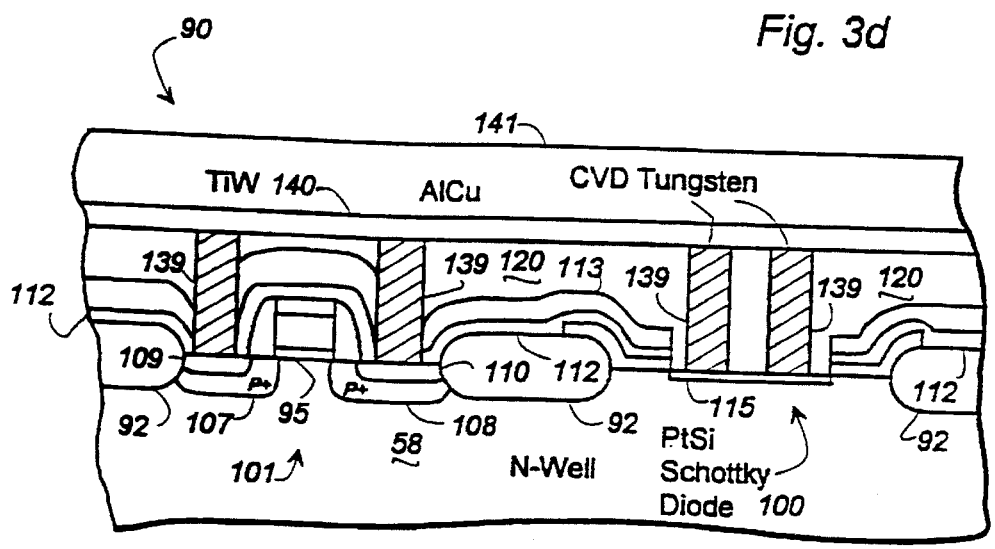

Thereafter, as shown in FIG. 3e, the photoresist mask layer 121 is removed and tungsten is deposited into the windows 130–133 to form tungsten plugs or posts 139 therein. The tungsten may be deposited by a non-selective CVD (chemical vapor deposition) process. For such non-selective process, all of the contacts need to have at least one dimension fixed in order to perform the tungsten deposition.

A titanium tungsten (TiW) sticky layer 140 is deposited overall followed by a metallization layer 141, such as AlCu, being deposited thereover. If desired, the titanium tungsten layer 140 can be planarized using a REB (resist etch back) process prior to the formation of the metallization layer 141 thereover. The titanium tungsten layer 140 and metallization layer 141 can thereafter be patterned to form the desired interconnect pattern on the structure 90.

The final structure 90 has tungsten interconnect plugs or posts 139 extending to the respective source, drain, and Schottky diode regions identified above. It should be noted that premetal planarization may not be required depending upon the method used for the tungsten etch back. Also, the resulting structure requires an additional two masking levels to typical prior art process flows.

Figure 4A:
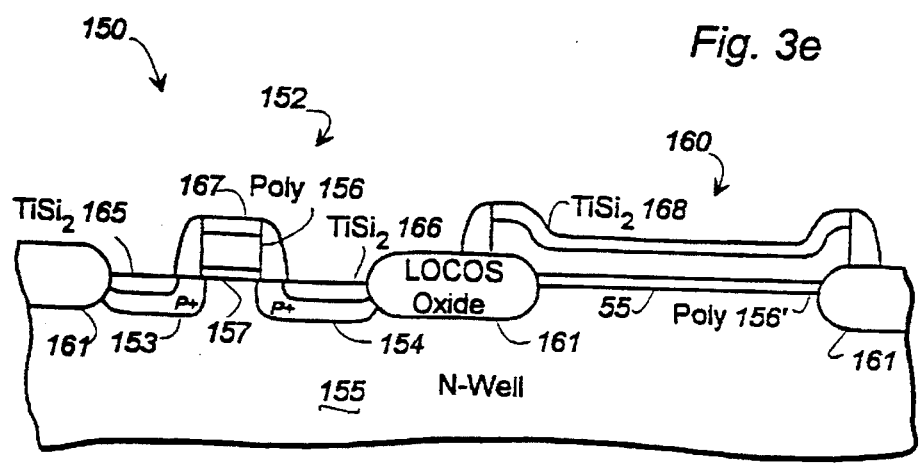
FIGS. 4a–4d are plan cross-sectional views of an integrated circuit chip in various stages of construction in the formation of a Schottky diode together with an FET device with interconnections thereto, in accordance with another preferred embodiment of the invention, using a polysilicon spacer layer.

Another embodiment of the invention is shown in FIGS. 4a–4d, in which a structure 150 is constructed having an FET transistor, a Schottky diode, and contacts thereto, using a polysilicon layer. As shown in FIG. 4a, the structure 150 has an FET device 152 constructed with a source region 153 and drain region 154 in an N-well substrate 155. The FET 152 has polysilicon gate 156 insulated from the channel in the N-well substrate 155 by one or more dielectric layers 157. The polysilicon gate 156 has been formed by an overall polysilicon layer that has been patterned to provide the polysilicon gate 156, as well as a polysilicon layer 156' overlying the Schottky diode moat region 160. As before, the polysilicon mask 156' overlying the Schottky diode moat region 160 also partially overlies the LOCOS oxide isolation regions 161 on its sides. Titanium is deposited and reacted to form titanium silicide regions 165, 166, and 167 in the respective source 153, drain 154, and gate 156 regions of the FET, as shown. The titanium silicide also forms a titanium silicide region 168 over the polysilicon mask 156' overlying the Schottky diode moat 160. As will be apparent below, only a portion of the polysilicon mask 156' is removed during the formation of the Schottky diode, which will leave portions of the polysilicon layer 156' with overlying titanium silicide regions 168 to serve to shield the single crystal silicon lying beneath it in the N-well substrate 155.

Figure 4B:
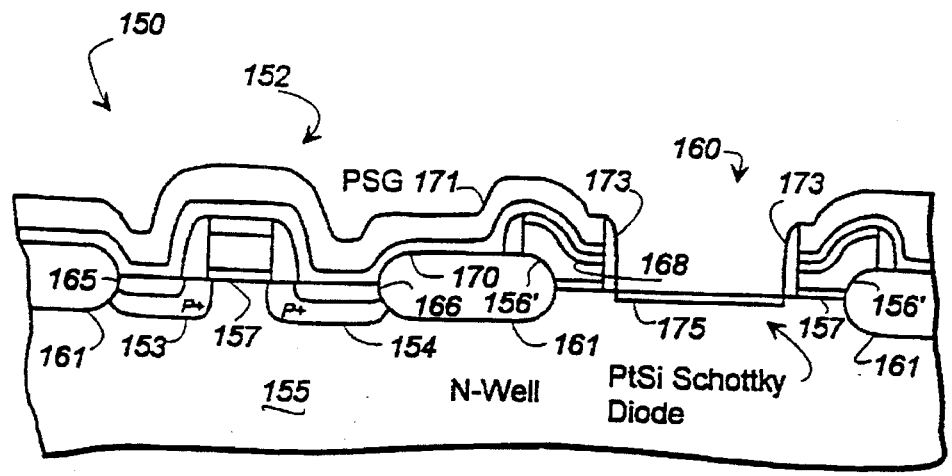

Prior to the formation of the Schottky diode, with reference now to FIG. 4b, a TEOS layer 170 and PSG layer 171 are formed overall and annealed, for example, at a temperature between about 700° C. and 900° C. for a time between about 45 minutes and 30 minutes. The Schottky diode window is then formed by masking and etching steps through the PSG layer 171, TEOS layer 170, titanium silicide region 168, polysilicon layer 156', and dielectric layer 157 to the surface of the N-well substrate 155. A second TEOS deposition may be performed, if desired, to provide sidewall TEOS layers 173 on the sidewalls of the Schottky diode window. Thus, to this point, all processes that require processing temperatures in excess of the temperature that would cause undesired diffusion of the metal of the Schottky diode within the substrate semiconductor material 155 have been performed.

A metal, preferably platinum, is then introduced and sintered within the window in the Schottky diode moat region 160 to form a Schottky diode 175 in the N-well substrate 155. Any excess platinum is then removed.

Figure 4C:
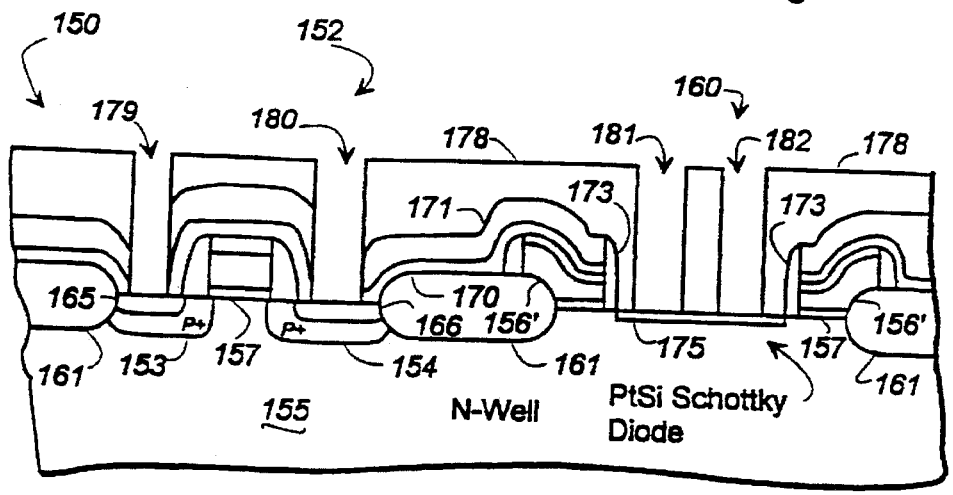
Figure 4D:
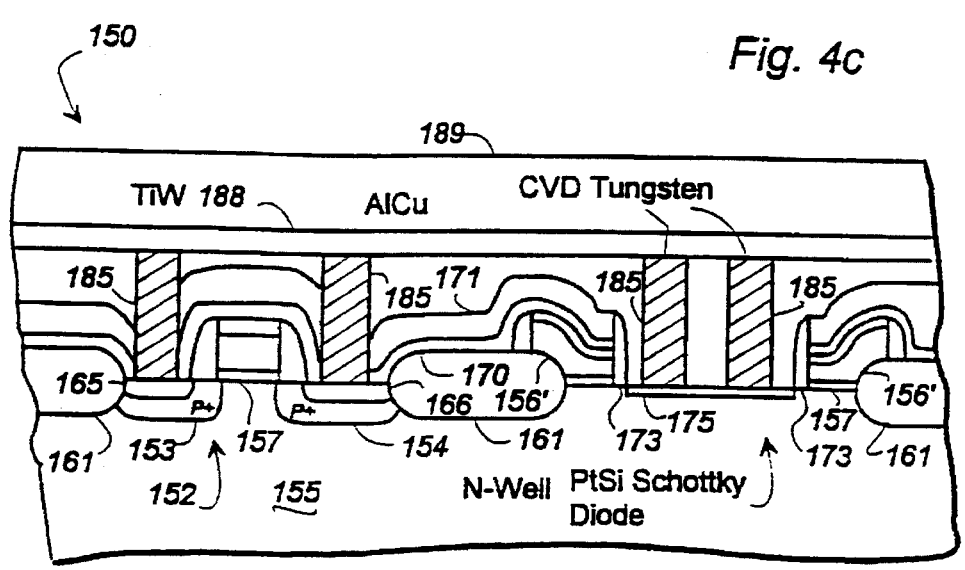

As shown in FIG. 4c, an oxide layer 178 is formed overall and patterned to provide windows 179, 180, 181, and 182 to enable contact material to be formed to the source 153 and gate 154 of the FET transistor 152, and to the Schottky diode 175. It is noted that two windows 181 and 182 are formed over the Schottky diode 175; however, any number of windows may be formed, depending upon the size and needed contact desired to the Schottky diode 175.

To complete the structure 150, metal is deposited into the respective windows 179–182 to provide a contact plug to the source 153 and drain 154 of the FET transistor 152 and to the platinum silicide Schottky diode 175. Thus, tungsten plugs or posts 185 may be formed by a CVD tungsten process that is performed at temperatures below 450° C. A titanium tungsten layer 188 is formed overall, and, planarized is desired. Finally, a metal layer 189, such as AlCu, is formed overall. The titanium tungsten 188 and AlCu 189 layers may then be patterned, if desired, for interconnecting various elements of the integrated circuit being fabricated.

The structure 150 fabricated in accordance with the process described above requires only one additional masking level to a typical process flow. Again, in order to successfully construct the contacts to the various integrated circuit elements, all contacts must have at least one dimension fixed to enable contacts to be successfully filled with a nonselective tungsten deposition. Although a second TEOS deposition and spacer etch are described in the above process to form the TEOS layer 170 prior to the platinum deposition, such TEOS deposition may not be required depending upon the desired platinum silicide Schottky diode characteristics and the selectivity of the etch used form the window to the Schottky diode moat region.

To this point, the Schottky diode construction in accordance with the invention has been described with reference to the formation of a p-channel FET device in an N-well substrate. It should be appreciated, however, that the process may be easily be adapted to use in processes in which CMOS type devices or bipolar and CMOS devices in a BiCMOS process or advanced BiCMOS process are fabricated. For example, as shown with reference now to FIGS. 5a–5c, a Schottky diode is formed in combination with a CMOS fabrication process.

Figure 5A:
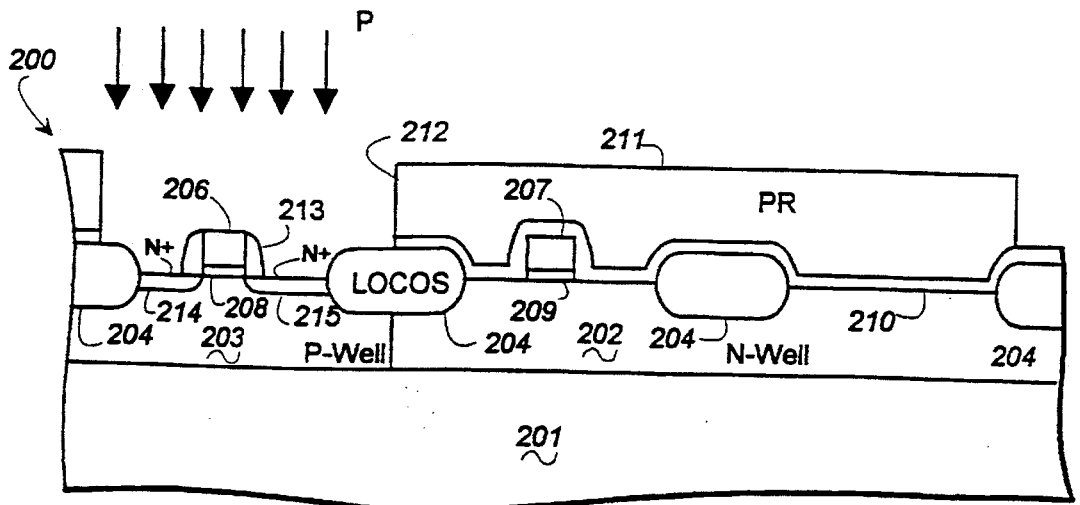
FIGS. 5a–5c are plan cross-sectional views of an integrated circuit chip in various stages of construction in the formation of a Schottky diode together with a CMOS devices, in accordance with another preferred embodiment of the invention, using a TEOS spacer layer.

Thus, as shown in FIG. 5a, a device structure 200 is shown that is fabricated on a silicon substrate 201, which may be lightly doped with an acceptor type impurity to be p-type. An N-well portion 202 may be provided for the construction of a p-channel FET device, and a P-well region 203 may be provided to enable construction of an n-channel FET device.

In the stage of construction of the structure 200 of FIG. 5a, LOCOS oxide isolation regions 204 have been constructed as well as polysilicon gates 206 and 207 of the respective n-channel and p-channel FET devices. The polysilicon gates 206 and 207 are formed over dielectric regions 208 and 209, respectively, and will provide the gate regions for the final transistor devices. A TEOS layer 210 has been fabricated overall, and, a photoresist mask 211 has been formed with a window 212 formed to expose the region of the n-channel transistor. The portion of the TEOS layer 210 overlying the region exposed by the window 212 is removed with a selective etch, thereby leaving TEOS sidewall mask regions 213 on the sidewalls of the gate 206. Thereafter, an implant of an n-type impurity, such as phosphorus or arsenic, is performed to create the n+ conductivity type regions to establish the source 214 and drain 215 regions of the n-channel transistor.

Figure 5B:
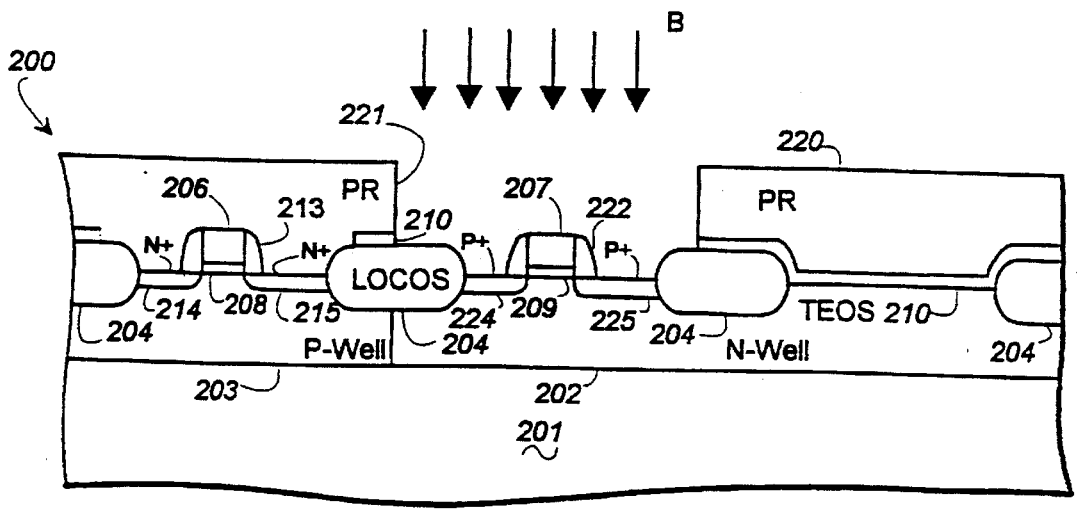

With reference now to FIG. 5b, the p-channel device is next formed. The photoresist layer 211 (FIG. 5a) is removed and a new photoresist mask layer 220 is applied. A window 221 is formed in the photoresist mask layer 220 to expose the region at which the p-channel transistor is to be formed. Within the window 221, the TEOS layer 210 is etched with a second selective etch to expose the regions at which the source and drain of the p-channel transistor are to be constructed, leaving TEOS mask regions 222 on the sidewalls of the gate 207. An acceptor type impurity, such as boron as shown, is implanted into the exposed regions of the N-well to form the source region 224 and drain region 225 to complete the construction of the p-channel transistor.

It should be noted that the order of completion of the n-channel and p-channel transistors is not critical, and can be reversed, if desired. It is important, however, that any processing steps that require processing temperatures above about 450° C. be performed before the formation of the Schottky diode, such as formation of titanium silicide next described.

Figure 5C:
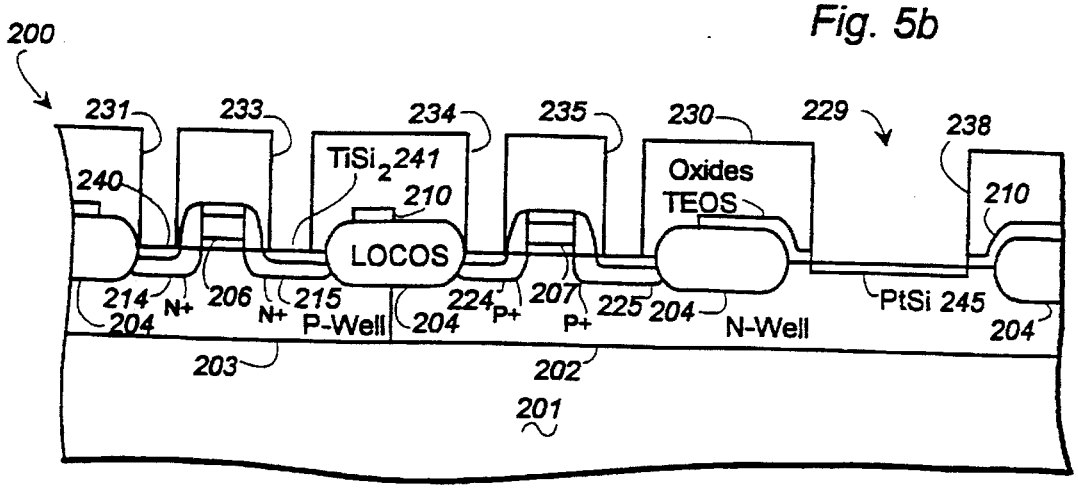

With reference now to FIG. 5c, the photoresist mask 220 (FIG. 5b), has been removed, and titanium has been deposited and reacted into the exposed regions of the structure 200. The TEOS layer 210 has served to protect the regions underlying it from the titanium atoms that have been implanted, thereby preserving the N-well region 229 at which the Schottky diode is desired to be formed, and the regions beneath the sidewalls of the gates 206 and 207 of the respective n-channel and p-channel transistors. Thus, the drain 214 and source 215 and gate 206 of the n-channel transistor have the exposed regions converted to titanium silicide, as shown. Similarly, the source 224, drain 225 and gate 207 of the p-channel transistor have the exposed regions converted to titanium silicide.

Thereafter, an oxide layer 230 is formed overall and planarized as shown. Windows 231 and 233 are formed in the oxide layer 230, extending to the titanium silicide regions 240 and 241 on the drain 214 and source 215 of the n-channel transistor by which connections can be established thereto. Similarly, windows 234 and 235 are formed in the oxide layer 230 extending to the source 224 and drain 225 regions of the p-channel transistor. Also, a window 238 is formed over the Schottky diode moat extending to the surface of the TEOS layer 210. The exposed TEOS layer 210 is then removed by an etching process, as shown in FIG. 5c, and platinum is deposited and sintered to form the platinum silicide Schottky diode 245. The device construction can then be completed by the formation of contacts to the devices, in a manner similar to that described above.

It should be noted that this approach provides for two TEOS spacer etches, one for the n-channel transistor and one for the p-channel transistor. The source and drain constructions for each transistor only open the particular transistor that is being processed, and can be used to pattern the TEOS spacer etch, instead of using a separate masking level. Thus, the overall number of masks required in the construction of the CMOS structure 200 are minimized.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. An integrated circuit, comprising:
   a semiconductor substrate;
   a FET device formed in said substrate, said FET device having source, drain, and gate elements;
   a region of $TiSi_2$ in each of said source, drain, and gate elements; and
   a Schottky diode comprising a layer comprising a metal in said substrate, wherein one of said $TiSi_2$ regions in said source and drain elements includes a region of platinum silicide.

* * * * *